US012571098B2

(12) United States Patent
Honma

(10) Patent No.: US 12,571,098 B2
(45) Date of Patent: Mar. 10, 2026

(54) APPARATUS AND METHOD FOR PERFORMING FILM FORMING PROCESS ON SUBSTRATES IN SUBSTRATE PROCESSING CHAMBERS

(71) Applicant: Tokyo Electron Limited, Tokyo (JP)

(72) Inventor: Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 738 days.

(21) Appl. No.: 17/820,294

(22) Filed: Aug. 17, 2022

(65) Prior Publication Data

US 2023/0068938 A1 Mar. 2, 2023

(30) Foreign Application Priority Data

Aug. 25, 2021 (JP) ................................. 2021-137435

(51) Int. Cl.
*C23C 16/44* (2006.01)
*C23C 16/455* (2006.01)
*C23C 16/458* (2006.01)

(52) U.S. Cl.
CPC .... *C23C 16/45551* (2013.01); *C23C 16/4408* (2013.01); *C23C 16/4412* (2013.01); *C23C 16/45574* (2013.01); *C23C 16/4584* (2013.01)

(58) Field of Classification Search
None
See application file for complete search history.

(56) References Cited

U.S. PATENT DOCUMENTS

| | | | | | |
|---|---|---|---|---|---|
| 6,769,629 | B2 * | 8/2004 | Hwang | ............. | C23C 16/45544 |
| | | | | | 118/715 |
| 2004/0255858 | A1 * | 12/2004 | Lee | ................... | C23C 16/45544 |
| | | | | | 118/715 |
| 2007/0095286 | A1 * | 5/2007 | Baek | ................. | C23C 16/45551 |
| | | | | | 118/719 |
| 2010/0116209 | A1 * | 5/2010 | Kato | ................. | C23C 16/45551 |
| | | | | | 118/730 |
| 2016/0083844 | A1 * | 3/2016 | Nishitani | .......... | C23C 16/45551 |
| | | | | | 118/719 |
| 2016/0273105 | A1 * | 9/2016 | de Ridder | ......... | C23C 16/45551 |
| 2018/0195172 | A1 * | 7/2018 | Tatsuoka | ........... | C23C 16/45576 |
| 2019/0316255 | A1 * | 10/2019 | Shugrue | ............ | C23C 16/45544 |

FOREIGN PATENT DOCUMENTS

| | | |
|---|---|---|
| JP | 2008172083 A | 7/2008 |
| JP | 2008524842 A | 7/2008 |
| JP | 2010-114391 A | 5/2010 |

* cited by examiner

*Primary Examiner* — Binu Thomas
(74) *Attorney, Agent, or Firm* — Armstrong Teasdale LLP

(57) ABSTRACT

A film forming apparatus includes: substrate processing chambers, which is formed by partitioning a space in a processing container in a circumferential direction when viewed from top, and in each of which a substrate is received and a receiving port for processing gases is formed to face a central portion of the processing container; a gas supply including a rotating body provided in the central portion of the processing container, and having a first gas supply hole and a second gas supply hole which are formed at different positions on a side peripheral surface of the rotating body along a circumferential direction; and a rotary mechanism configured to rotate the rotating body around a vertical axis such that a first processing gas and a second processing gas are switched and repeatedly supplied to the substrate processing chambers via the receiving ports, respectively.

5 Claims, 15 Drawing Sheets

APPARATUS AND METHOD FOR PERFORMING FILM FORMING PROCESS ON SUBSTRATES IN SUBSTRATE PROCESSING CHAMBERS

CROSS-REFERENCE TO RELATED APPLICATION

This application is based upon and claims the benefit of priority from Japanese Patent Application No. 2021-137435, filed on Aug. 25, 2021, the entire contents of which are incorporated herein by reference.

TECHNICAL FIELD

The present disclosure relates to an apparatus for forming a film on a substrate and a method of forming a film on a substrate.

BACKGROUND

In a manufacturing process of semiconductor devices, a film forming process may sometimes be performed by supplying a plural types of gases sequentially to a semiconductor wafer (hereinafter referred to as a wafer) as a substrate. As such an apparatus, Patent Document 1 discloses a film forming apparatus in which a rotating body is provided at a central position of a susceptor on which a plurality of wafers is placed, and a first processing gas and a second processing gas are supplied from the rotating body. The rotating body is provided with a member configured to form separation regions that separate atmospheres of processing regions to which the first processing gas and the second processing gas are supplied, respectively, and when the rotating body is rotated, the respective processing regions and the separation regions are rotated and pass above the susceptor. As a result, the first processing gas and the second processing gas are supplied sequentially and repeatedly to each of the wafers placed on the susceptor, thereby forming a film.

PRIOR ART DOCUMENT

[Patent Document]
   Patent Document 1: Japanese Patent Laid-Open Publication No. 2010-114391

SUMMARY

According to one embodiment of the present disclosure, there is provided an apparatus that performs a film forming process on a substrate in a processing container, the apparatus including: a plurality of substrate processing chambers, which is formed by partitioning a space in the processing container in a circumferential direction when the processing container is viewed from top, and in each of which the substrate is received and a receiving port for processing gases is formed to face a central portion of the processing container; a gas supply including a rotating body provided in the central portion of the processing container, and having a first gas supply hole configured to supply a first processing gas and a second gas supply hole configured to supply a second processing gas, wherein the first processing gas and the second processing gas react with each other to form a thin film of a reaction product on a surface of the substrate, and wherein the first gas supply hole and the second gas supply hole are formed at different positions on a side peripheral surface of the rotating body along a circumferential direction; and a rotary mechanism configured to rotate the rotating body around a vertical axis such that the first processing gas and the second processing gas are switched and repeatedly supplied to the substrate processing chambers via the receiving ports, respectively.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, as one embodiment of an apparatus for performing a film forming process according to the present disclosure, a film forming apparatus 1 that performs a film forming process by atomic layer deposition (ALD) onto a wafer W as a substrate will be described. The film forming apparatus 1 of this example is configured such that a raw material gas containing silicon (Si) and a nitriding gas, which is a reaction gas that reacts with the raw material gas, are supplied to the wafer W and react with each other to form a silicon nitride layer (SiN layer). By repeating the reaction a plurality of times, a silicon nitride (SiN) film is formed on a surface of the wafer W. In the following, a case where dichlorosilane (DCS) gas is used as the raw material gas and ammonia ($NH_3$) gas is used as the nitriding gas will be described as an example. In this example, the DCS gas corresponds to a first processing gas, and the ammonia gas corresponds to a second processing gas.

Figure 1:
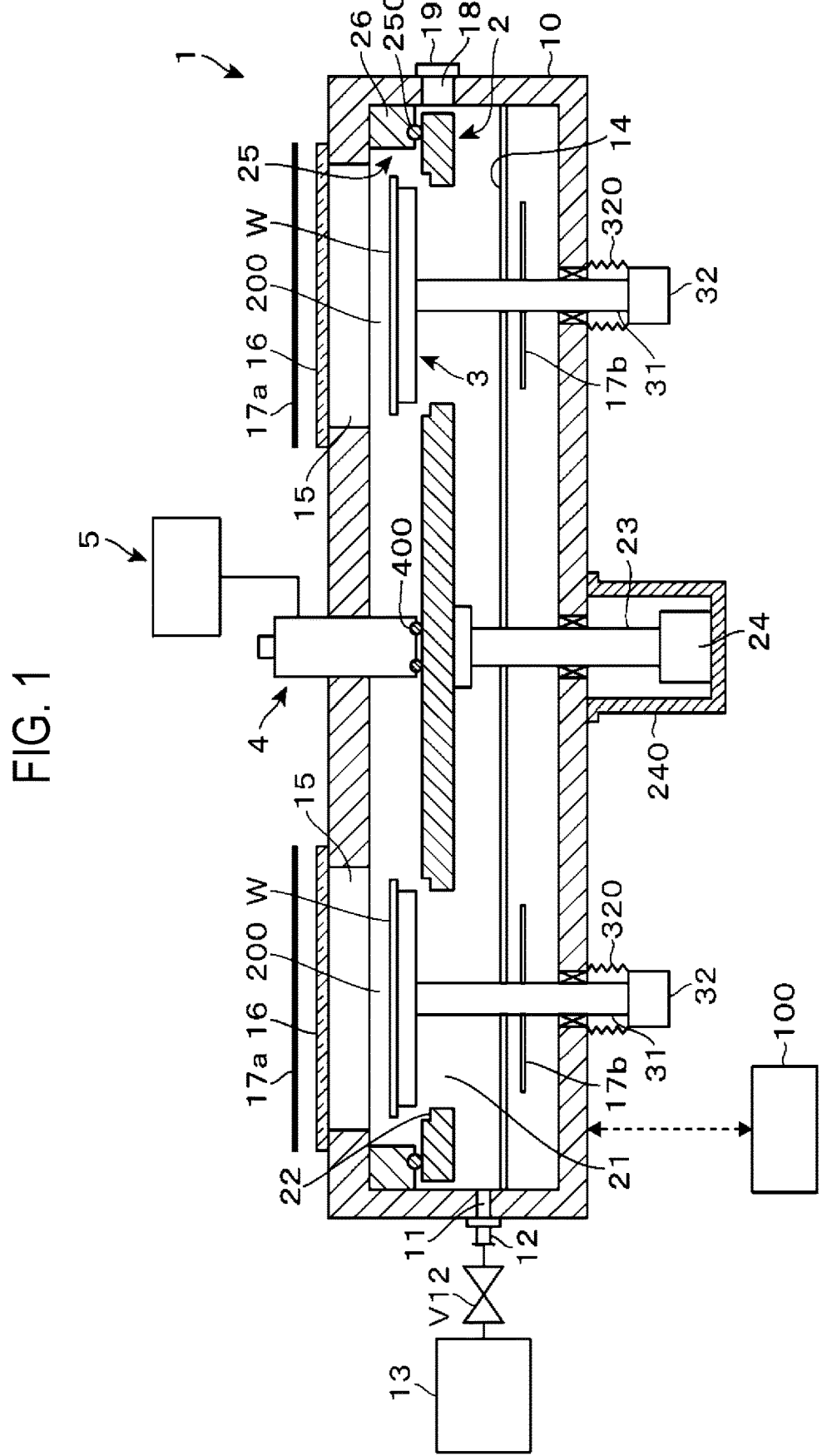
FIG. 1 is a vertical cross-sectional side view showing a film forming apparatus according to the present disclosure.
Figure 2:
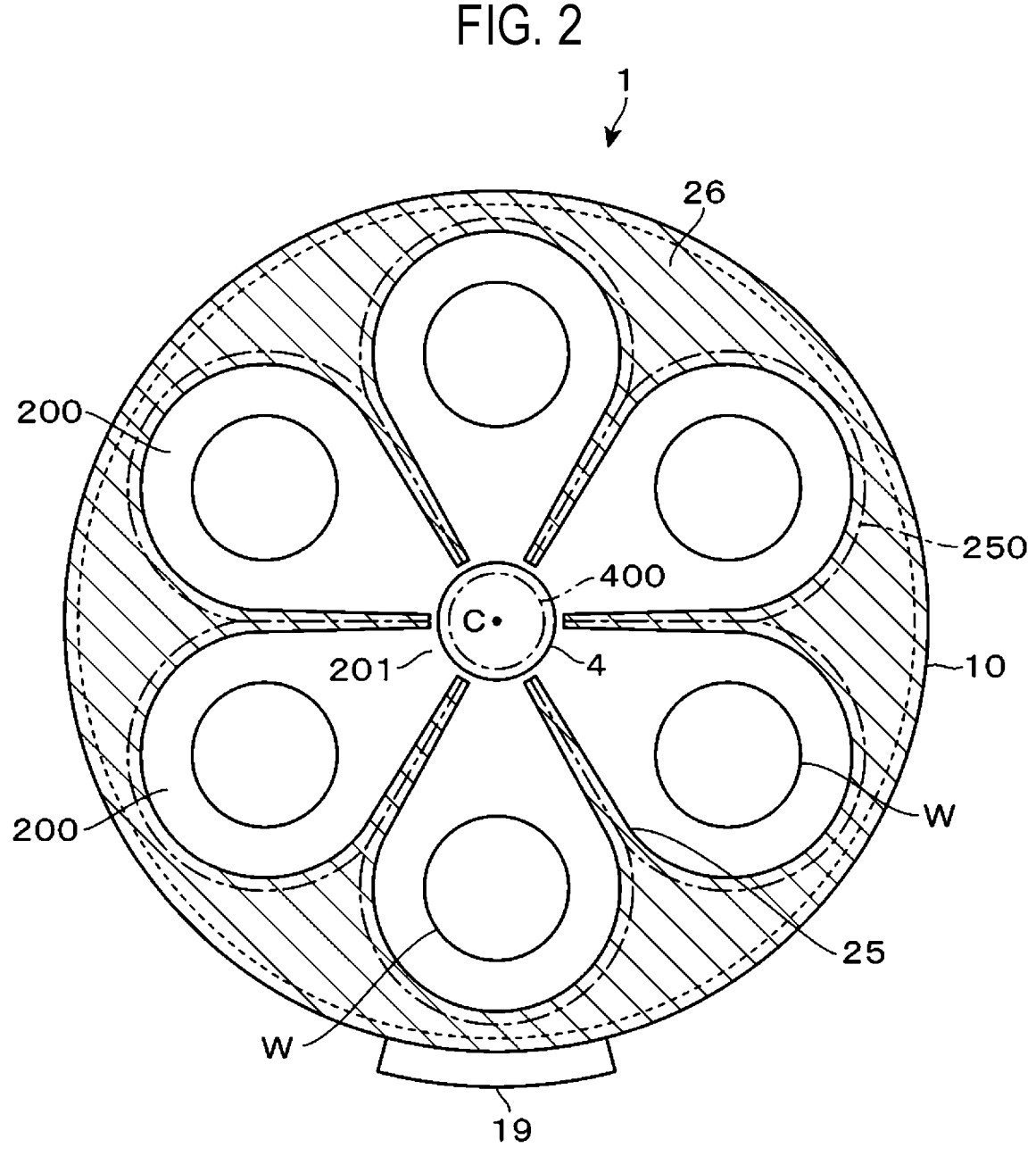
FIG. 2 is a cross-sectional plan view of a processing container constituting the film forming apparatus when view from above.
Figure 3:
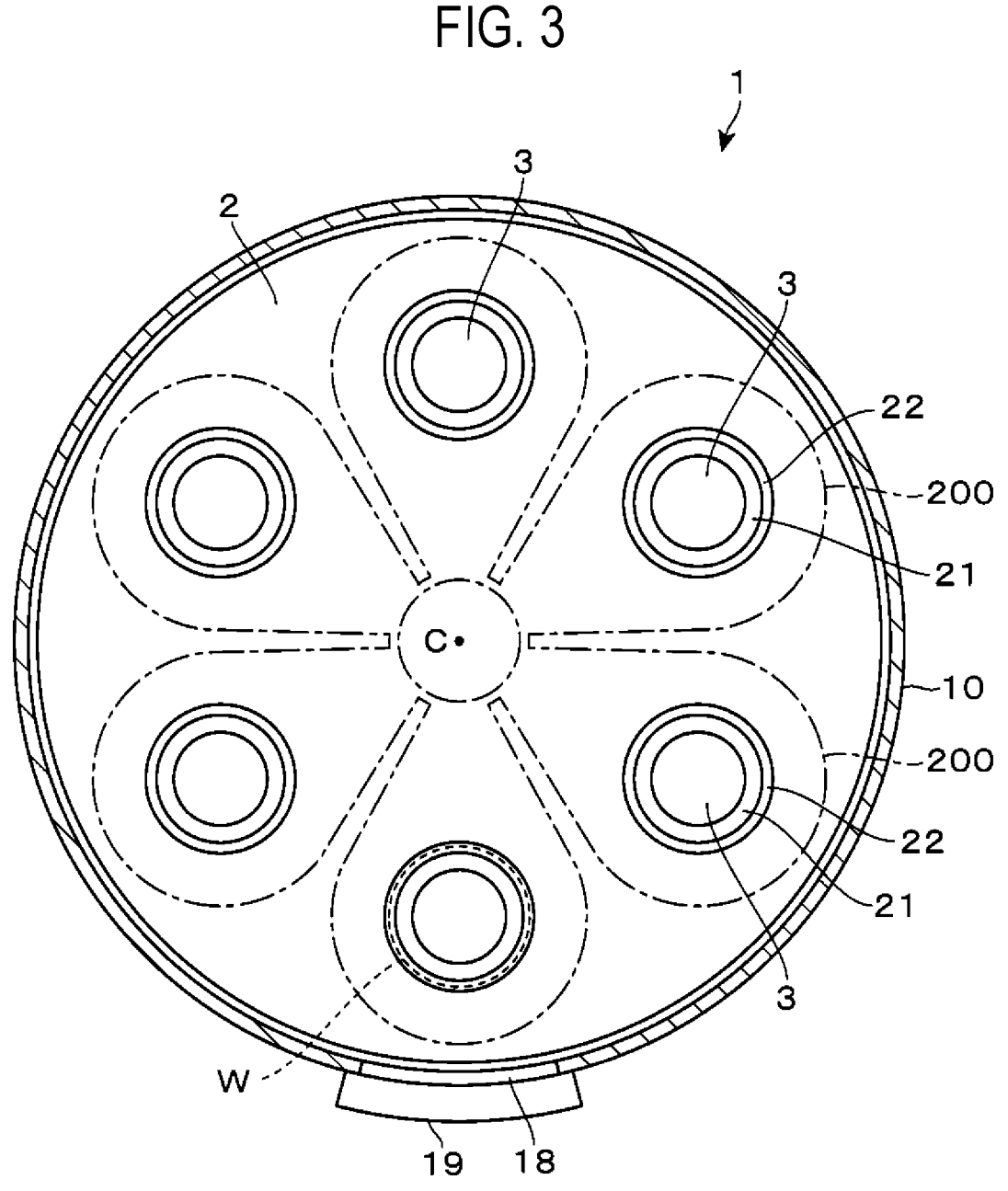
FIG. 3 is a cross-sectional plan view of the processing container when viewed from below.

As shown in FIGS. 1 to 3, the film forming apparatus 1 includes a processing container 10 having a substantially circular planar shape, and a susceptor 2 provided in the processing container 10 and having a circular shape in a plan view. The susceptor 2 is provided so as to vertically partition a space of the processing container 10. From this point of view, the susceptor 2 corresponds to a partition of this example.

As shown in FIGS. 1 to 3, circular openings 21 having a size capable of receiving the wafer W therein are formed in the susceptor 2. The openings 21 are formed at a plurality of locations, for example, six locations, along a circumferential direction of the susceptor 2. The openings 21 are formed correspondingly to arrangement positions of wafers W in a wafer processing chamber 200 to be described later. On an inner peripheral surface of each opening 21, a rim 22 that supports periphery of the wafer W received in the opening 21 is formed, for example, over an entire circumference.

A rotary shaft 23 extending in a vertical direction is connected to a central portion of a lower surface of the susceptor 2. For example, the rotary shaft 23 passes through a bottom surface of the processing container 10, and has a lower end portion connected to a drive mechanism 24 provided below the processing container 10. The susceptor 2 is configured to be capable of being raised and lowered and being rotated by the drive mechanism 24. The lower end portion of the rotary shaft 23 and the drive mechanism 24 are covered with a cover 240 such that airtightness in the processing container 10 is maintained.

Above a central portion of an upper surface of the susceptor 2, a gas supply 4 having a circular columnar shape is provided so as to pass through a ceiling surface of the processing container 10. A detailed configuration of the gas supply 4 will be described later.

In a space between the ceiling surface of the processing container 10 and the susceptor 2, a plurality of partition walls 25, six partition walls 25 in this example, which partitions the space along the circumferential direction of the susceptor 2 is provided. As shown in FIG. 2, in a plan view, the partition walls 25 are provided so as to extend along a radial direction from a side of a side wall portion of the processing container 10 toward a central portion of the susceptor 2. Here, the partition walls 25 of this example are configured such that a thickness dimension thereof gradually decreases from a side of a peripheral edge of the susceptor 2 toward the central portion of the susceptor 2.

The partition walls 25 are formed to leave a region in which the gas supply 4 described above is disposed, on a side of the central portion of the susceptor 2. In addition, an outer peripheral wall 26, which is formed along the opening 21 described above to form a side wall having a circular arc shape in a plan view, is disposed on a side of an outer peripheral portion of the susceptor 2. An outer peripheral end of each partition wall 25 is connected to the outer peripheral wall 26.

A lower surface of the partition wall 25 and a lower surface of the gas supply 4 are configured such that height positions thereof are aligned with each other. In addition, as shown in FIGS. 1 and 2, contact-type seals 400 and 250 are provided on the lower surface of the gas supply 4 and the lower surface of the partition wall 25, respectively.

When the susceptor 2 is raised to a height position (space-forming position) where the contact-type seals 400 and 250 are brought into contact with the upper surface thereof by using the drive mechanism 24 described above, a space surrounded by the partition wall 25 and the outer peripheral wall 26 is closed by the susceptor 2. Thus, wafer processing chambers 200 configured to accommodate wafers W with the wafers W being received in the respective openings 21 are partitioned and formed on the upper surface of the susceptor 2. As shown in FIG. 2, the contact-type seals 400 and 250 are provided to surround a periphery of each wafer processing chamber 200 over an entire circumference. The wafer processing chambers 200 correspond to substrate processing chambers of this example, and the partition walls 25 and the outer peripheral wall 26 correspond to walls that form the wafer processing chambers 200.

Here, when viewed from the central portion of the susceptor 2 along the circumferential direction, regions sandwiched by end portions of adjacent ones of the partition walls 25 on a side of the central portion constitute receiving ports 201 that are open toward the central portion (see FIG. 2).

Further, when the susceptor 2 is lowered to a position (retracted position) below the space-formation position by the drive mechanism 24, each wafer processing chamber 200 is released. From this point of view, the drive mechanism 24 and the rotary shaft 23 correspond to a lifting mechanism of the susceptor 2.

As shown in FIGS. 1 and 3, a transfer port 18 for loading and unloading the wafers W is formed on the side wall of the processing container 10 at a height position between the susceptor 2 and the outer peripheral wall 26 when the susceptor 2 is lowered to the retracted position. The transfer port 18 can be opened and closed by a gate valve 19.

In addition, the film forming apparatus 1 includes a plurality of stages 3 configured to raise the wafers W received in the rim 22 of the respective openings 21 and hold the wafers W horizontally at a height position (processing position) above the upper surface of the susceptor 2. Each stage 3 is configured with a disk-shaped member, and a rotary shaft 31 is connected to a lower surface thereof. For example, the rotary shaft 31 passes through the bottom surface of the processing container 10, and a lower end thereof is connected to a drive mechanism 32 provided below the processing container 10. The stages 3 are configured to be capable of being raised and lowered and being rotated by the drive mechanism 32. A region where the lower end of the rotary shaft 31 passes through the bottom surface of the processing container 10 is covered with a cover 320 such that airtightness in the processing container 10 is maintained.

A diameter of the disk-shaped stages 3 is smaller than an opening diameter of the openings 21. Thus, the stage 3 can be inserted into the wafer processing chamber 200 through the opening 21 and raised to the processing position. In addition, when the stage 3 is lowered, the stage 3 can be moved to a withdrawal position where the stage 3 has been withdrawn to the outside of the wafer processing chamber 200 through the opening 21. Further, as shown in FIGS. 6 to 9 to be described later, the withdrawal position of the stage 3 is set to a height position lower than the retracted position of the susceptor 2. The drive mechanism 32 and the rotary shaft 31 correspond to the lifting mechanism configured to raise and lower the stage 3, and also correspond to a substrate rotation mechanism configured to rotate the wafer W placed on the stage 3 around a vertical axis.

As shown in FIG. 1, a window hole 15 covered with a window 16 made of, for example, quartz glass is formed on the ceiling surface of the processing container 10 facing an upper surface of the stages 3 raised to the processing position. A heater 17a made of, for example, a carbon wire is disposed above the window 16. The heater 17a emits infrared rays by electric power supplied from a power supply (not illustrated), thereby heating the wafer W held on the stage 3 via the window 16 to a preset temperature. For example, the heater 17a is used when performing, after performing a film forming process on the wafer W, an annealing process on a formed SiN film. In addition, although FIG. 1 illustrates a configuration of the heater 17a in a simplified manner, each heater 17a is received in a housing (not illustrated) configured to partition the heater 17a from a surrounding atmosphere.

On the other hand, in a space below the susceptor 2 in the processing container 10, a heater 17b similar to the heater 17a disposed on a side of the ceiling surface of the process-ing container 10 is disposed below each stage 3. A space between each heater 17b and the susceptor 2 is partitioned by a bottom plate 14 made of, for example, quartz glass. The heater 17b emits infrared rays by electric power supplied from a power supply (not illustrated), thereby heating a rear surface of the stage 3. In addition, instead of the heater 17b disposed below the stage 3, a heater made of a resistance heating element may be embedded in the stage 3.

In addition, an exhaust port 11 is formed on the side wall of the processing container 10 forming a space between the susceptor 2 and the bottom plate 14 (the space below the susceptor 2). The exhaust port 11 is connected to an exhauster 13 via an exhaust pipe 12 provided with an on-off valve V12. The exhauster 13 performs vacuum evacuation in the wafer processing chambers 200 through the respective openings 21 formed in the susceptor 2.

Figures 4A, 4B:
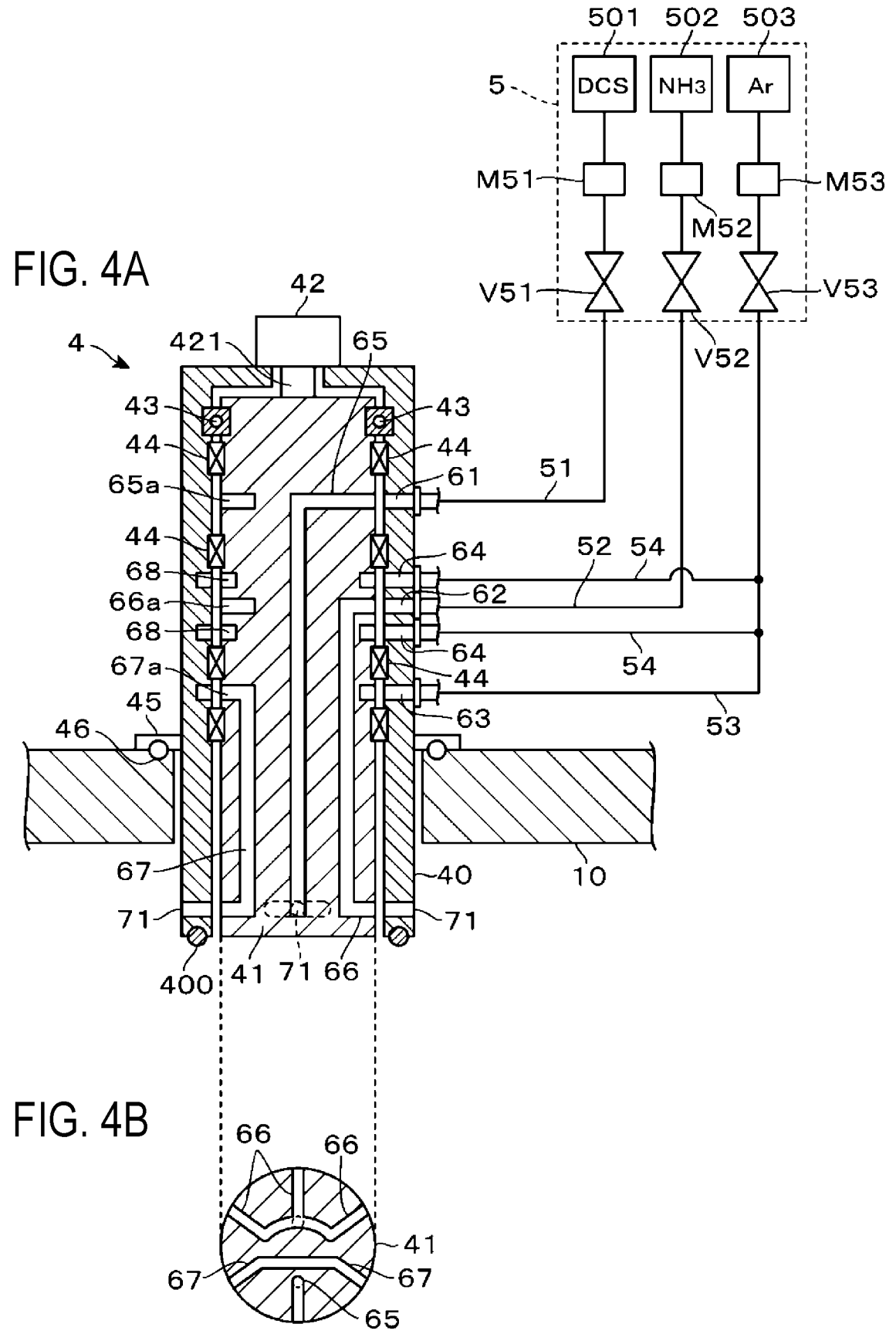
FIGS. 4A and 4B are a vertical cross-sectional side view and a cross-sectional plan view of a gas supply of the film forming apparatus, respectively.

Next, a configuration of the gas supply 4 will be described. As shown in FIGS. 4A and 4B, the gas supply 4 includes a cylindrical tubular body 40 having an open lower surface, and a circular columnar member 41 inserted inside the tubular body 40 and serving as a rotating body in which a gas flow path is formed.

Figure 5:
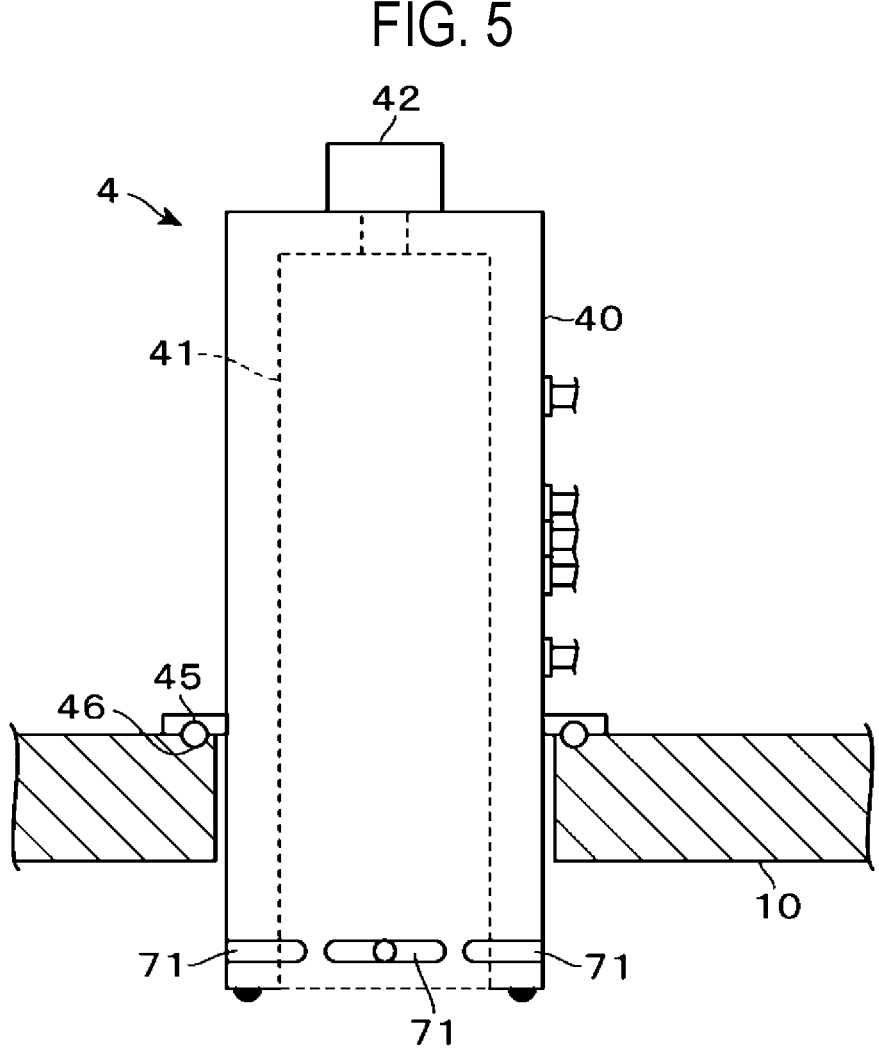
FIG. 5 is an external side view of the gas supply of the film forming apparatus.

As shown in FIGS. 4A, 4B, and 5, the tubular body 40 is disposed to penetrate the ceiling surface of the processing container 10 in the vertical direction such that a lower portion thereof is inserted into the processing container 10. A flange 45 is provided on an outer peripheral surface of the tubular body 40, and by placing the flange 45 on the upper surface of the processing container 10, the tubular body 40 is fixed to the processing container 10. An O-ring 46 configured to maintain the atmosphere in the processing container 10 airtight is provided between a lower surface of the flange 45 and the upper surface of the processing container 10.

On a side wall surface of the tubular body 40 protruding from the upper surface of the processing container 10, gas inlets (a DCS gas inlet 61, an ammonia gas inlet 62, a purge gas inlet 63, and separation gas inlets 64) configured to receive various gases from a gas supply mechanism 5 to be described later are formed.

On the other hand, as shown in FIG. 5, which is an external view of the gas supply 4 (the tubular body 40), a plurality of gas supply slits 71 is formed on a lower end portion of the tubular body 40 inserted into the processing container 10 along a circumferential direction of the tubular body 40. Each gas supply slit 71 is configured to extend over a region corresponding to the receiving port 201 of each wafer processing chamber 200, which has been described with reference to FIG. 2. Alternatively, instead of providing the gas supply slits 71 in the tubular body 40, a height position of the lower end of the tubular body 40 may be set to be above a height position where openings of gas flow paths 65, 66, and 67 to be described later are formed, thereby exposing the openings.

The circular columnar member 41 is inserted into the tubular body 40 via the opening on the lower surface of the tubular body 40. A rotary shaft 421 is connected to an upper surface of the circular columnar member 41. The rotary shaft 421 penetrates the upper surface of the tubular body 40, and an upper end thereof is connected to a rotary drive 42 disposed on the tubular body 40 and formed by a rotary motor or the like. With this configuration, the circular columnar member 41 is in a state of being suspended by the rotary drive 42.

A bearing 43 and a plurality of bearings 44 are provided at different height positions between an inner peripheral surface of the tubular body 40 and an outer peripheral surface of the circular columnar member 41. Thus, when the rotary shaft 421 is rotated by the rotary drive 42, the circular columnar member 41 rotates in the tubular body 40. The rotary drive 42 and the rotary shaft 421 constitute a rotary mechanism that rotates the circular columnar member 41.

In the circular columnar member 41, annular grooves 65a, 66a, and 67a are formed at height positions that correspond to the height positions of the DCS gas inlet 61, the ammonia gas inlet 62, and the purge gas inlet 63 formed in the tubular body 40, respectively. Each of the annular grooves 65a, 66a, and 67a is a groove-shaped flow path formed over an entire circumference of the outer peripheral surface of the circular columnar member 41.

In addition, the gas flow paths 65, 66, and 67 are formed in the circular columnar member 41 so as to be connected to the annular grooves 65a, 66a, and 67a, respectively.

That is, the DCS gas flow path 65 is connected to the annular groove 65a formed at a height position correspond-ing to the DCS gas inlet 61. The DCS gas flow path 65 is formed to extend in the horizontal direction from the con-nection position with the annular groove 65a toward a radial center of the circular columnar member 41, and then changes a formation direction thereof downward. In addi-tion, the DCS gas flow path 65 changes the formation direction horizontally again at the height position where the gas supply slit 71 of the tubular body 40 is formed, extends outward in the radial direction, and then is opened on the outer peripheral surface of the circular columnar member 41 (see also the cross-sectional plan view of FIG. 4B).

The ammonia gas flow path 66 is connected to the annular groove 66a formed at a height position corresponding to the ammonia gas inlet 62. The ammonia gas flow path 66 is formed to extend in the horizontal direction from the con-nection position with the annular groove 66a toward the radial center of the circular columnar member 41, and then changes a formation direction thereof downward. Then, as shown in the cross-sectional plan view of FIG. 4B, the ammonia gas flow path 66 is branched into three at the height position where the gas supply slits 71 of the tubular body 40 are formed. The branched ammonia gas flow paths 66 are formed to extend in the horizontal direction toward different directions, and are opened on the outer peripheral surface of the circular columnar member 41, respectively. Here, as shown in FIG. 4B, the openings of these three ammonia gas flow paths 66 are formed at intervals so as to be adjacent to one another along the circumferential direc-tion of the outer peripheral surface of the circular columnar member 41.

In addition, the purge gas flow path 67 is connected to the annular groove 67a formed at a height position correspond-ing to the purge gas inlet 63. The purge gas flow path 67 is formed to extend in the horizontal direction from the connection position with the annular groove 67a toward the radial center of the circular columnar member 41, and then changes a formation direction thereof downward. Then, as shown in the cross-sectional plan view of FIG. 4B, the purge gas flow path 67 is branched into two at the height position where the gas supply slits 71 of the tubular body 40 are formed. The branched ammonia gas flow paths 66 are formed to extend in the horizontal direction toward different directions, and are opened on the outer peripheral surface of the circular columnar member 41, respectively. Here, as shown in FIG. 4B, the openings of these two ammonia gas flow paths 66 are formed at positions between the opening of the DCS gas flow path 65 and the openings of the ammonia gas flow path 66.

As shown in FIG. 4B, the openings of the respective gas flow paths 65, 66, and 67 on the outer peripheral surface of the circular columnar member 41 are formed at equal intervals from one another. Among the respective openings shown in FIG. 4B, the opening of the DCS gas flow path 65 corresponds to a first gas supply hole for supplying the first processing gas. Further, the openings of the ammonia gas flow path 66 correspond to a second gas supply hole for supplying the second processing gas. Moreover, the openings of the purge gas flow path 67 correspond to a purge gas supply hole for supplying a purge gas to be described later.

In addition, for convenience of explanation, positions of the gas flow paths 65, 66, and 67 illustrated in FIG. 4A are adjusted in order to make it easier to understand connection relationships with the gas inlets 61, 62, 63 or annular grooves 65a, 66a, and 67a, respectively. Thus, FIG. 4A does not strictly represent the vertical cross-sectional shape of the actual gas flow paths 65, 66, and 67.

As shown in FIG. 4A, the separation gas inlets 64 are provided above and below the ammonia gas inlet 62 described above. In addition, separation gas flow paths 68 are formed at height positions corresponding to height positions where the separation gas inlets 64 are formed. Each separation gas flow path 68 is a groove-shaped path formed over the entire circumference of the outer peripheral surface of the circular columnar member 41.

Next, a configuration of the gas supply mechanism 5 that supplies various gases to the gas supply 4 having the configuration described above will be described.

The gas supply mechanism 5 is provided with a DCS source 501 storing DCS gas as a raw material gas, an ammonia source 502 storing ammonia gas as a nitriding gas, and an inert gas source 503 storing argon (Ar) gas as an inert gas. Mass flow controllers M51, M52, and M53 and on-off valves V51, V52, and V53 are connected to the gas sources 501, 502, and 503, respectively.

A DCS gas supply line 51 is connected to the DCS source 501 at a downstream side of the on-off valve V51. A downstream end of the DCS gas supply line 51 is connected to the DCS gas inlet 61, and serves to supply the DCS gas to the DCS gas flow path 65.

In addition, an ammonia gas supply line 52 is connected to the ammonia source 502 at a downstream side of the on-off valve V52. A downstream end of the ammonia gas supply line 52 is connected to the ammonia gas inlet 62, and serves to supply the ammonia gas to the ammonia gas flow path 66.

In addition, a purge gas supply line 53 is connected to the inert gas source 503 at a downstream side of the on-off valve V51. A downstream end of the purge gas supply line 53 is connected to the purge gas inlet 63, and serves to supply the Ar gas as the purge gas to the purge gas flow path 67.

In addition, two separation gas supply lines 54 are branched from the purge gas supply line 53. Downstream ends of the separation gas supply lines 54 are connected to the separation gas inlets 64, and serve to supply the Ar gas as the separation gas to the separation gas flow paths 68.

Returning to FIG. 1, the film forming apparatus 1 having the configuration described above includes a controller 100. The controller 100 is configured with a computer having a CPU and a storage, and controls respective components of the film forming apparatus 1. A program in which a group of steps (instructions) for controlling operations of the film forming apparatus 1 and the like is incorporated is recorded in the storage. The program is stored in a non-transitory computer readable storage medium such as, for example, a hard disk, a compact disk, a magnetic optical disk, and a memory card, and is installed in the computer from the storage medium.

Next, an operation of the film forming apparatus 1 will be described.

In a state before the wafer W to be processed is loaded into the film forming apparatus 1, the heaters 17a and 17b are in an off state, and the susceptor 2 and the stage 3 stand-by in a state in which the susceptor 2 has been moved to the retracted position and the stages 3 have been moved to the withdrawal position. In addition, by being rotated by the drive mechanism 24, the susceptor 2 is in a state where the opening 21 via which the wafer W is loaded faces the transfer port 18.

Figure 6:
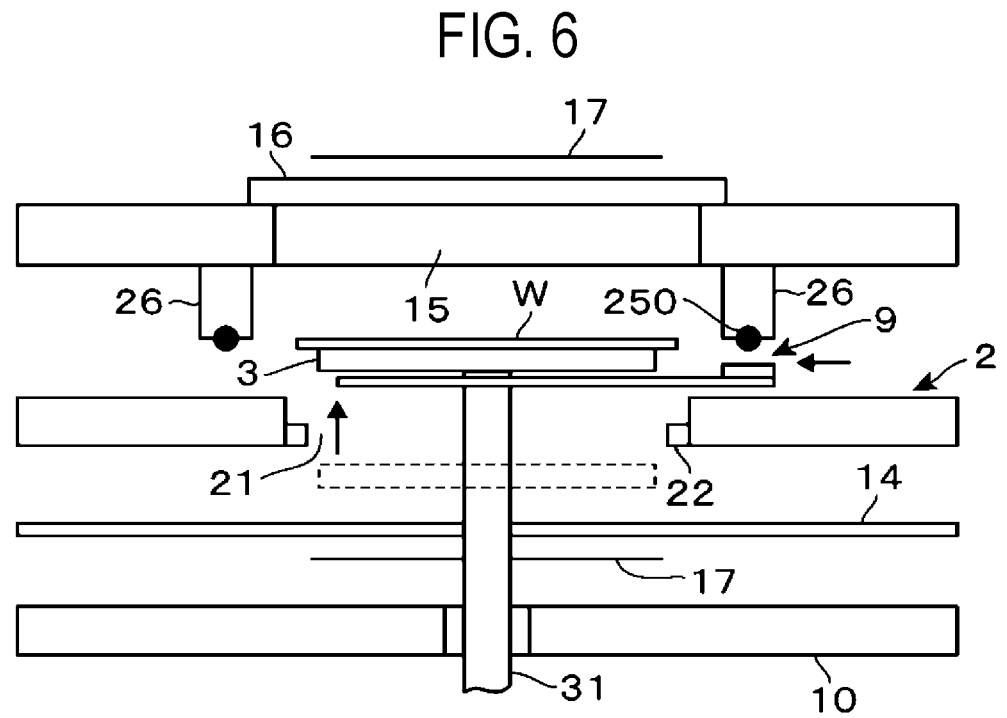
FIG. 6 is a first explanatory view of an operation of a film forming process in a wafer processing chamber.

Subsequently, as shown in FIG. 6, the gate valve 19 is opened, and an external transfer mechanism 9 holding the wafer W enters the film forming apparatus 1. The transfer mechanism 9 stops at a position above the opening 21. Here, the transfer mechanism 9 includes, for example, a fork for holding a peripheral edge portion of the wafer W. The fork is configured to hold a region closer to a peripheral edge of the wafer W than a region of the wafer W held by the stage 3.

Thereafter, the stage 3 below the transfer mechanism 9 is raised from the withdrawal position to the processing position. An entry height of the transfer mechanism 9 is set to a height position lower than the processing position, and delivery of the wafer W is carried out by pushing up the wafer W held on the transfer mechanism 9 from below by the stage 3. As described above, in the film forming apparatus 1 of this example, the wafer W is transferred (loaded and unloaded) between a region serving as the wafer processing chamber 200 and the outside, via a gap formed between the susceptor 2 and the lower end of the outer peripheral wall 26 forming a part of the wall of the wafer processing chamber 200.

Figure 7:
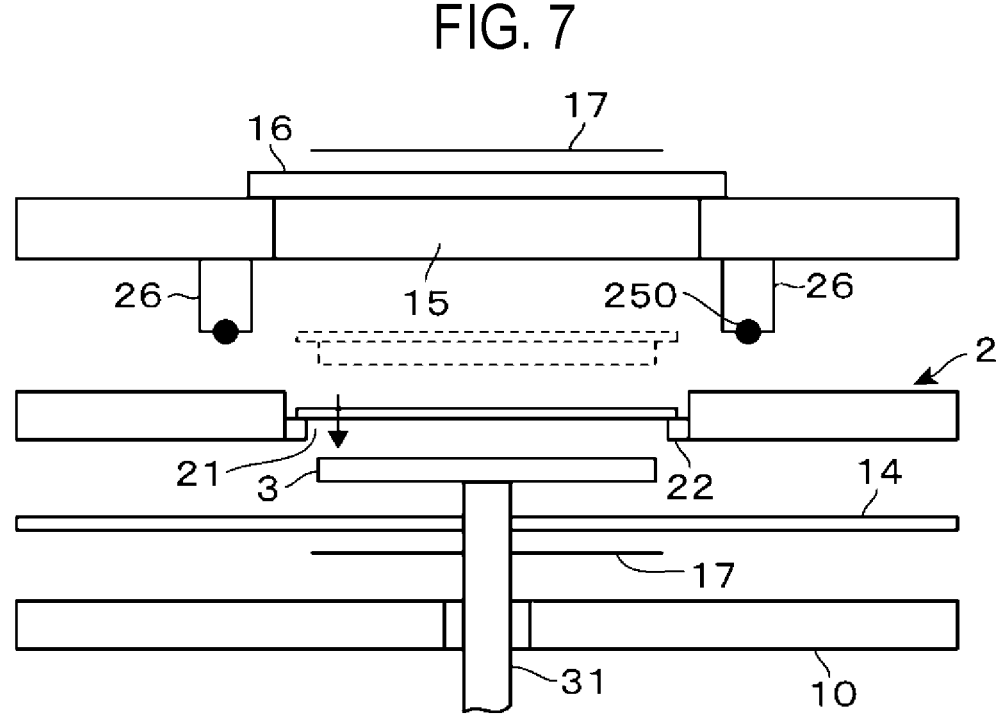
FIG. 7 is a second explanatory view of the operation of the film forming process in the wafer processing chamber.

Subsequently, as shown in FIG. 7, the transfer mechanism 9 is withdrawn out of the film forming apparatus 1, and the stage 3 that has received the wafer W is lowered to the withdrawal position. By this operation, the wafer W is delivered to the rim 22 formed in the opening 21 of the susceptor 2.

Subsequently, the susceptor 2 is rotated to cause the opening 21 into which a wafer W has not been loaded to be positioned in front of the transfer port 18. Then, by repeating the operation described above with reference to FIGS. 6 and 7, wafers W are delivered to all the openings 21, and the gate valve 19 is closed.

Figure 8:
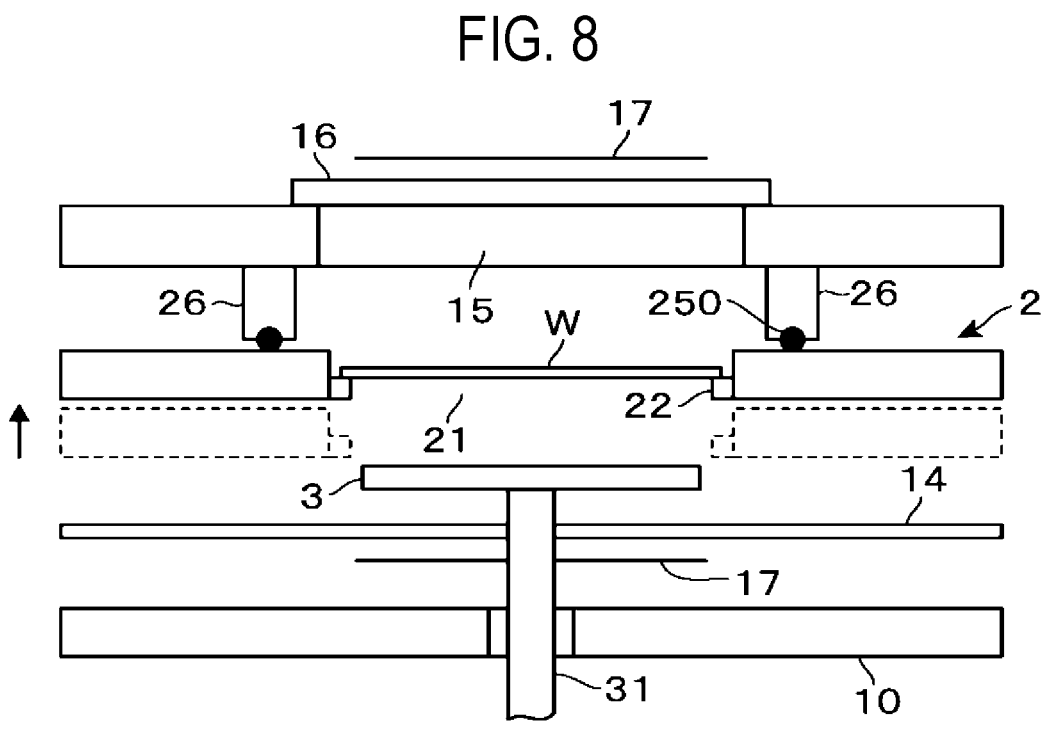
FIG. 8 is a third explanatory view of the operation of the film forming process in the wafer processing chamber.

Subsequently, as shown in FIG. 8, the susceptor 2 is raised to the space-forming position, and the outer peripheral wall 26 and the lower surface of the gas supply 4 (specifically, the contact-type seals 250 and 400) are brought into contact with the surface of the susceptor 2. By this operation, the wafer processing chambers 200 are formed around the gas supply 4.

Figure 9:
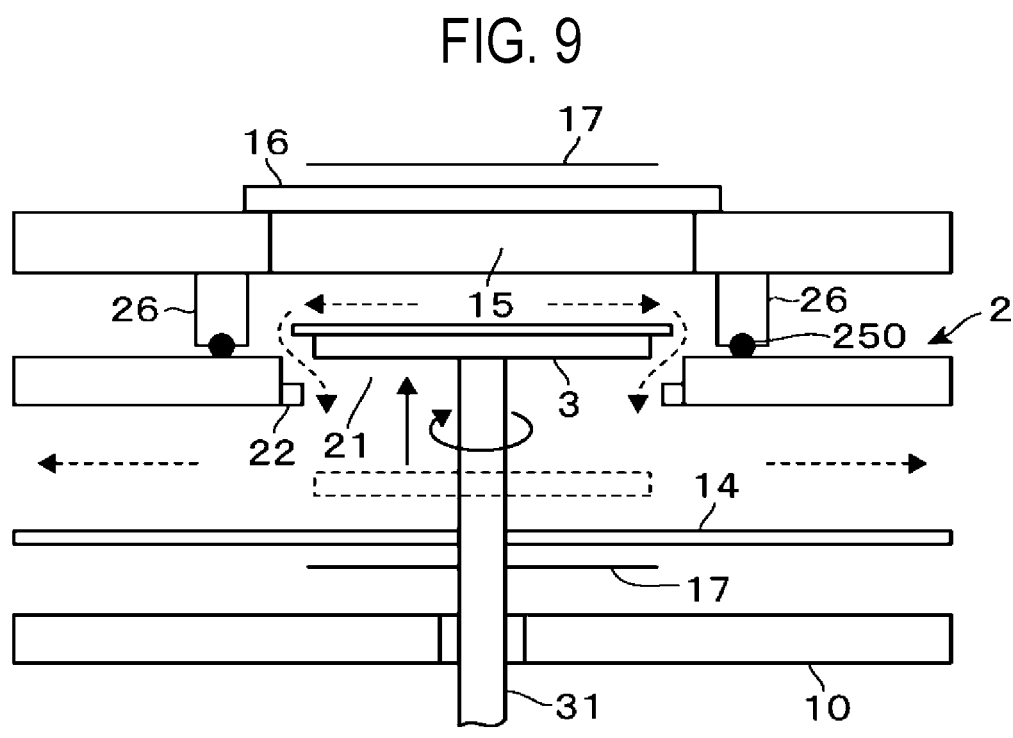
FIG. 9 is a fourth explanatory view of the operation of the film forming process in the wafer processing chamber.

In addition, the stages 3 provided correspondingly to the respective openings 21 are raised to the processing position, and at the same time, vacuum evacuation is performed by the exhauster 13. By this operation, as shown in FIG. 9, the wafers W in the respective openings 21 are transferred to the stages 3, resulting in disposing the wafers W in the processing position. Further, by raising the wafers W, the openings 21 are opened, and the atmosphere in the wafer processing chambers 200 can be exhausted via the openings 21. Thereafter, the stages 3 are rotated around the vertical axis, and at the same time, the heaters 17b below the stages 3 are turned on.

In addition, in the gas supply 4 shown in FIGS. 4A and 4B, the circular columnar member 41 is rotated by the rotary drive 42, and supply of various gases from the gas supply mechanism 5 starts. As a result, the DCS gas introduced from the DCS gas inlet 61 passes through the annular groove 65a and the DCS gas flow path 65 and is discharged from the one opening on a side of the lower end thereof. Further, the ammonia gas introduced from the ammonia gas inlet 62 passes through the annular groove 66a and the ammonia gas flow path 66 and is discharged from the three openings on a side of the lower end thereof.

Furthermore, the purge gas introduced from the purge gas inlet 63 passes through the annular groove 67a and the purge gas flow path 67 and is discharged from the two openings on a side of the lower end thereof.

In addition, the separation gas introduced from the separation gas inlets 64 flows into the separation gas flow path 68, which is an annular groove, and a part thereof flows out into a gap between the outer peripheral surface of the circular columnar member 41 and the inner peripheral surface of the tubular body 40. Thus, it is possible to prevent the DCS gas supplied to the DCS gas flow path 65 and the ammonia gas supplied to the ammonia gas flow path 66 from coming into contact with each other, and to suppress formation of reaction products in the gas supply 4.

By the operation described above, the openings of the respective gas flow paths 65, 66, and 66 of the circular columnar member 41, which is rotating, pass through the region where the gas supply slits 71 are formed. As a result, the gases discharged from these openings are supplied to the wafer processing chambers 200 via the receiving ports 201 formed in the region facing the gas supply slits 71. Here, height positions at which the respective gases are discharged via the gas supply slits 71 are set to be above the height position where the wafers W are held by the stages 3 at the processing position.

As described above, in the respective wafer processing chambers 200, various gases can be switched and supplied from the gas supply 4 with the stages 3 (the wafers W) inserted in the wafer processing chambers 200.

Supply of the respective gases to the wafer processing chambers 200 will be described with reference to FIGS. 10A to 11C. In FIGS. 10A to 11C, the wafer processing chamber 200 hatched with diagonal lines indicates that the DCS gas is supplied thereto. A flow of the DCS gas is represented by the bold line arrow. In addition, the wafer processing chambers 200 hatched with dots indicate that the ammonia gas is supplied thereto. Flows of the ammonia gas is represented by the thin solid line arrows. In addition, the wafer processing chambers 200 with no hatching indicate that the purge gas is supplied thereto. Flow of the purge gas is represented by the dashed-line arrows. For ease of explanation, the wafer processing chambers 200 are designated with identification numerals (1) to (6) in FIGS. 10A to 11C.

Figure 10A:
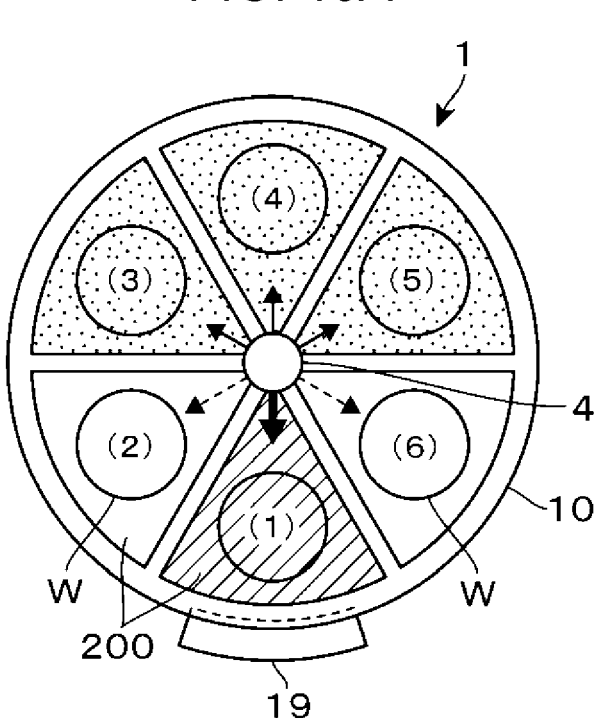
FIGS. 10A to 10C are first operation views showing the film forming process in the film forming apparatus.
Figure 10B:
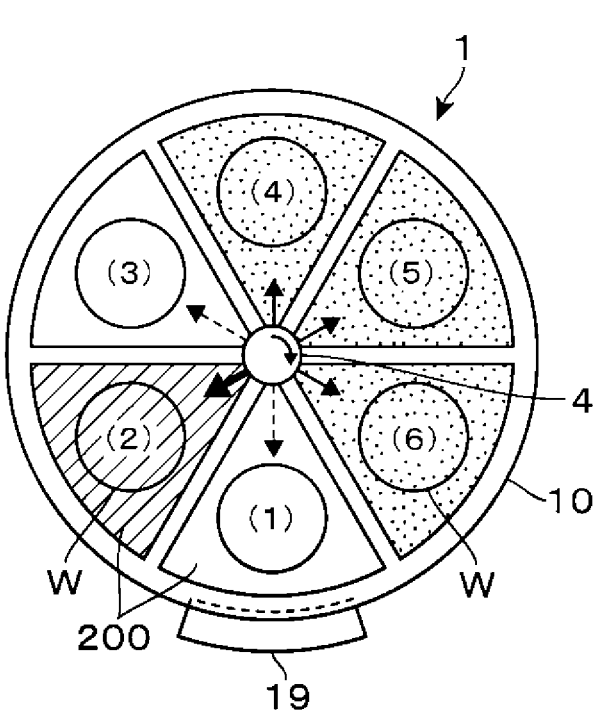
Figure 10C:
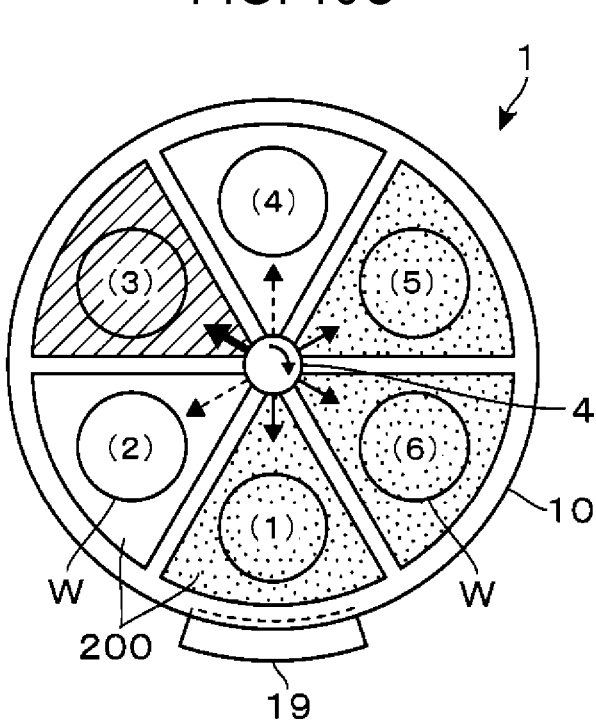
Figure 11A:
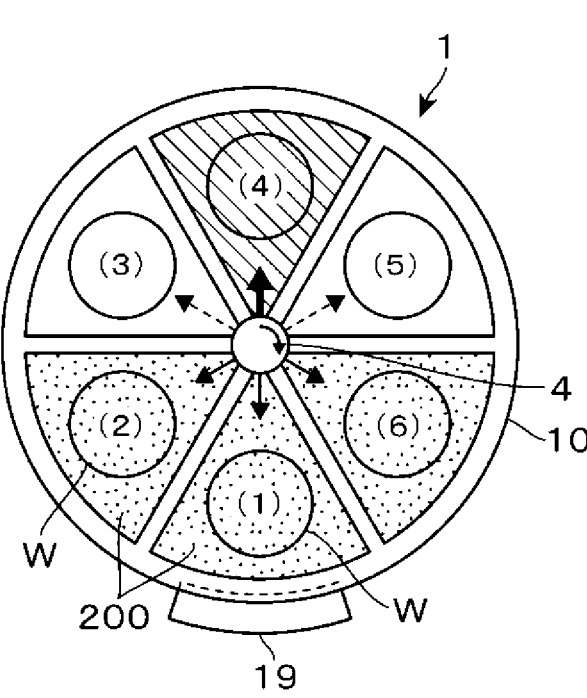
FIGS. 11A to 11C are second operation views showing the film forming process in the film-forming apparatus.
Figure 11B:
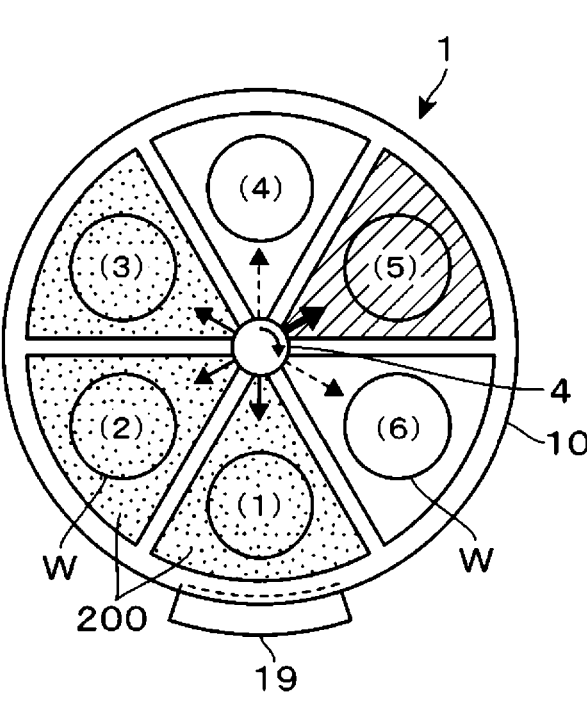
Figure 11C:
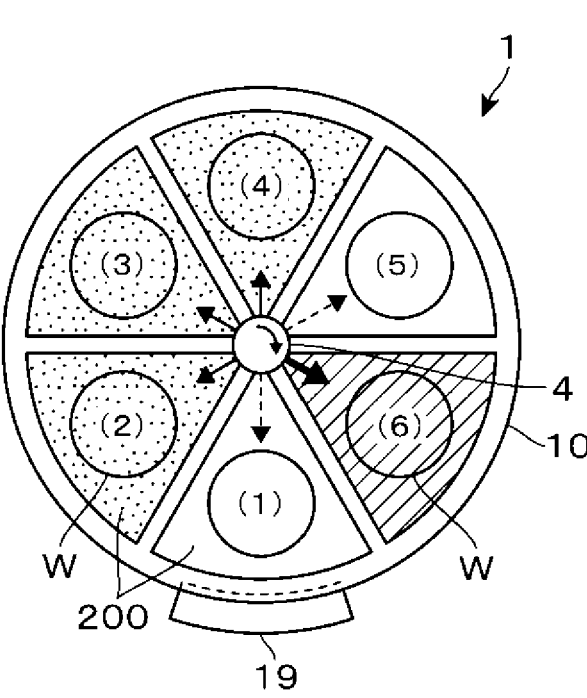

In the example shown in FIG. 10A first, at a predetermined timing, the DCS gas is supplied to the wafer processing chamber 200 of (1) facing the transfer port 18, and the purge gas is supplied to the wafer processing chambers 200 of (2) and (6) located on the left-hand side and the right-hand side of the wafer processing chamber 200 of (1), respectively. Further, the ammonia gas is supplied to the wafer processing chambers 200 of (3) to (5) on the inner side when viewed from the transfer port 18. Although the description is simplified in FIGS. 10A to 10C and FIGS. 11A to 11C, the gases supplied from the gas supply 4 are supplied into the respective wafer processing chambers 200 via the receiving ports 201 described above.

Then, from the state of FIG. 10A, the circular columnar member 41 in the gas supply 4 is rotated, for example, in the clockwise direction when viewed from above, while discharging the respective gases. Accordingly, the state of gas supply to the respective wafer processing chambers 200 is sequentially switched in the order of FIGS. 10A to 10C and FIGS. 11A to 11C.

Accompanying the gas supply operation described above, contents of processes carried out in the respective wafer processing chambers 200 will be described. By taking the wafer processing chamber 200 of (1) facing the transfer port 18 as an example, first, the DCS gas is supplied as shown in FIG. 10A. Subsequently, the gas supplied to the wafer processing chamber 200 of (1) is switched from the DCS gas to the purge gas, the ammonia gas, the ammonia gas, the ammonia gas, and the purge gas in this order. Further, by rotating the circular columnar member 41, the respective gases are supplied repeatedly in the same order.

With respect to the other wafer processing chambers 200 of (2) to (6) as well, the gases are supplied repeatedly in the order of the DCS gas, the purge gas, the ammonia gas, the ammonia gas, the ammonia gas, and the purge gas.

By switching and supplying the various gases as described above, the DCS gas is first adsorbed to the surface of the wafer W received in each wafer processing chamber 200. The unadsorbed DCS gas is discharged to the space below the susceptor 2 via the openings 21, and then is discharged to the exhauster 13 via the exhaust port 11 (the same is applied to discharge of the other gases). Subsequently, by supplying the purge gas, the discharge of the unadsorbed DCS gas in the wafer processing chamber 200 is promoted. Subsequently, the ammonia gas is supplied to the wafer processing chamber 200, and DCS adsorbed on the wafer W reacts with the ammonia gas to form a thin layer of silicon nitride (SiN), which is a reaction product, on the surface of the wafer W. Subsequently, the purge gas is supplied to the wafer processing chamber 200, thereby promoting the discharge of the ammonia gas remaining in the wafer processing chamber 200.

By continuing the rotation of the circular columnar member 41, the gases are repeatedly supplied in the order of the DCS gas, the purge gas, the ammonia gas, and the purge gas. As a result, the formation of the thin layer of SiN described above is repeated to deposit the SiN layers, and a SiN film is formed on the wafer W.

When the circular columnar member 41 is rotated for a predetermined period of time and a SiN film of a preset thickness is formed on the wafer W received in each wafer processing chamber 200, as described above, the supply of the respective gases from the gas supply mechanism 5 is stopped, and at the same time, the rotation of the circular columnar member 41 is stopped. Thereafter, when necessary, the heaters 17a are turned on to perform an annealing process. Subsequently, by stopping the rotation of the stages 3 and lowering the stages 3 to the withdrawal position, the wafer W is transferred to the rim 22 of the opening 21. Thereafter, the processed wafers W are sequentially transferred to the external transfer mechanism 9 by a procedure opposite to the operations described with reference to FIGS. 6 to 9. At this time, after the operation of unloading the wafer W from each opening 21 has been performed, a loading operation of transferring the wafer W to be processed next to that opening 21 may be performed.

The film forming apparatus 1 of the present embodiment has a configuration in which the processing gases are switched and supplied from the gas supply 4 having the circular columnar member 41 rotating therein to the plurality of wafer processing chambers 200 that is disposed fixedly. Therefore, it is possible to perform a process efficiently by sequentially supplying a plural types of processing gases (DCS gas and ammonia gas) to a plurality of wafers W, respectively, with a simple configuration.

Here, in the film forming apparatus 1 having the configuration described above, the types of the processing gases supplied to the wafer processing chambers 200 are not limited to the example described above. For example, a silicon-containing gas other than the DCS gas, such as bis(tertiary-butylamino)silane (BTBAS) gas, may be used as the raw material gas that is the first processing gas. The type of element contained in the raw material gas is not limited to silicon, and may contain other types of metal elements such as titanium and tungsten. Further, in a case of forming a film of composite oxide and the like, a plural types of different raw material gases may be supplied separately to adjacent ones of the wafer processing chambers 200.

In addition, as for the reaction gas that is the second processing gas as well, in addition to the ammonia gas for forming the SiN film, oxygen gas or ozone gas for forming a SiO film may be employed. In addition, when it is necessary to activate such a reaction gas, an activation mechanism, such as an inductively coupled antenna or a microwave antenna, which plasmarizes and activates the reaction gas may be provided on the ceiling surface of the processing container 10 facing the stages 3.

When supplying the raw material gas and the reaction gas, a supply pattern of the various gases to the plurality of wafer processing chambers 200 is not limited to the example described with reference to FIGS. 10A to 11C. For example, correspondingly to easiness of adsorption of the raw material gas, the number of wafer processing chambers 200 to which the raw material gas is supplied may be increased to two or more. Moreover, correspondingly to easiness of reaction of the reaction gas, the number of wafer processing chambers 200 to which the reaction gas is supplied may be reduced to two or less.

In addition, it is not essential to provide the wafer processing chambers 200 to which the purge gas is supplied. For example, when a concentration of the raw material gas or the reaction gas in each wafer processing chamber 200 can be sufficiently reduced only with the vacuum evacuation by the exhauster 13, it is not necessary to supply the purge gas. In this case, the supply of the raw material gas and the reaction gas may be performed alternately using, for example, the wafer processing chambers 200 of (1) to (6) shown in FIG. 10A.

In addition, the number of wafer processing chambers 200 provided in the film forming apparatus 1 is not limited to the example of six chambers, but may be five or less (however, a plurality of wafer processing chambers 200 is provided), or seven or more.

In addition, in the film forming apparatus 1 that switches and supplies the plural types of gases to each wafer processing chamber 200 by rotating the circular columnar member 41, it is not an essential requirement to insert the rotatable stage 3 into each wafer processing chamber 200 to process the wafer W. For example, the stages 3 may be fixedly disposed on the upper surface of the susceptor 2 configured to be capable of being raised and lowered. In this case, for example, the film forming apparatus 1 may be configured such that the exhaust port 11 is provided in each wafer processing chamber 200 on a side of the side wall of the processing container 10 to perform vacuum evacuation in each wafer processing chamber 200.

According to the present disclosure in some embodiments, it is possible to perform a process efficiently by sequentially supplying a plural types of processing gases to a plurality of substrates, respectively, with a simple configuration.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus that performs a film forming process on substrates in a processing container, the apparatus comprising:

a plurality of substrate processing chambers, which is formed by partitioning a space in the processing container in a circumferential direction when the processing container is viewed from top, and in each of which a substrate is received and a receiving port for processing gases is formed to face a central portion of the processing container;

a gas supply including a rotating body provided in the central portion of the processing container, and having a first gas supply hole configured to supply a first processing gas and a second gas supply hole configured to supply a second processing gas, wherein the first processing gas and the second processing gas react with each other to form a thin film of a reaction product on a surface of the substrate, and wherein the first gas supply hole and the second gas supply hole are formed at different positions on a side peripheral surface of the rotating body along a circumferential direction; and a rotary mechanism configured to rotate the rotating body around a vertical axis such that the first processing gas and the second processing gas are switched and repeatedly supplied to the substrate processing chambers via the receiving ports, respectively, wherein the substrate processing chambers are formed by a partition that vertically partitions a space in the processing container, and a wall that partitions a space between a ceiling surface of the processing container and the partition in a circumferential direction, wherein the partition includes a lifting mechanism configured to raise and lower the partition between a space-forming position at which an upper surface of the partition is in contact with a lower end of the wall to form the plurality of substrate processing chambers, and a retracted position to which the partition is retracted below the space-forming position, and wherein the substrate is loaded and unloaded between inside and outside of the substrate processing chambers via a gap formed between the lower end of the wall and the partition by moving the partition to the retracted position.

2. The apparatus of claim 1, wherein three or more substrate processing chambers are formed in the processing container, and wherein a purge gas supply hole configured to supply a purge gas to the substrate processing chambers to which the first processing gas and the second processing gas have not been supplied is formed on the side peripheral surface of the rotating body of the gas supply at a position between the first gas supply hole and the second gas supply hole when viewed along the circumferential direction.

3. The apparatus of claim 2, further comprising:

a plurality of openings formed in the partition correspondingly to arrangement positions of substrates in the substrate processing chambers;

a plurality of stages provided correspondingly to the plurality of substrate processing chambers, respectively, and configured to be capable of being raised and lowered between a processing position at which the stages hold the substrates in a state of being inserted into the substrate processing chambers via the openings and a withdrawal position to which the stages are withdrawn outside the substrate processing chambers; and an exhauster connected to a space below the partition in the processing container, and configured to perform vacuum evacuation of the plurality of substrate processing chambers via the openings.

4. The apparatus of claim 3, wherein each of the plurality of stages is provided with a substrate rotary mechanism configured to rotate the substrate placed on the stage around a vertical axis.

5. A method of performing a film forming process on substrates in a processing container, wherein the method uses:

a plurality of substrate processing chambers, which is formed by partitioning a space in the processing container in a circumferential direction when the processing container is viewed from top, and in each of which a substrate is received and a receiving port for processing gases is formed to face a central portion of the processing container; and a gas supply including a rotating body provided in the central portion of the processing container, and having a first gas supply hole configured to supply a first processing gas and a second gas supply hole configured to supply a second processing gas, wherein the first processing gas and the second processing gas react with each other to form a thin film of a reaction product on a surface of the substrate, and wherein the first gas supply hole and the second gas supply hole are formed at different positions in a side peripheral surface of the rotating body along a circumferential direction, and wherein the method comprises:

rotating the rotating body around a vertical axis; and switching and repeatedly supplying the first processing gas and the second processing gas from the rotating body, which is rotating, to the substrate processing chambers via the receiving ports, respectively, wherein the substrate processing chambers are formed by a partition that vertically partitions a space in the processing container, and a wall that partitions a space between a ceiling surface of the processing container and the partition in a circumferential direction, wherein the partition includes a lifting mechanism configured to raise and lower the partition between a space-forming position at which an upper surface of the partition is in contact with a lower end of the wall to form the plurality of substrate processing chambers, and a retracted position to which the partition is retracted below the space-forming position, and wherein the substrate is loaded and unloaded between inside and outside of the substrate processing chambers via a gap formed between the lower end of the wall and the partition by moving the partition to the retracted position.

* * * * *